(12) United States Patent
Kim

(10) Patent No.: US 8,861,261 B2
(45) Date of Patent: Oct. 14, 2014

(54) SEMICONDUCTOR MEMORY CELL AND SEMICONDUCTOR DEVICE

(75) Inventor: Seung Hwan Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 187 days.

(21) Appl. No.: 13/327,458

(22) Filed: Dec. 15, 2011

(65) Prior Publication Data
US 2012/0300557 A1    Nov. 29, 2012

(30) Foreign Application Priority Data

May 25, 2011    (KR) .................. 10-2011-0049711

(51) Int. Cl.
*G11C 11/24*    (2006.01)
*H01L 27/108*    (2006.01)

(52) U.S. Cl.
CPC .... *H01L 27/10876* (2013.01); *H01L 27/10888* (2013.01); *H01L 27/10885* (2013.01)
USPC .............................. 365/149; 365/63; 257/334

(58) Field of Classification Search
USPC ..................... 365/149, 63; 257/334
See application file for complete search history.

(56) References Cited

U.S. PATENT DOCUMENTS

| | | | | |
|---|---|---|---|---|
| 5,036,493 | A * | 7/1991 | Nielsen | 365/230.03 |
| 6,118,719 | A * | 9/2000 | Dell et al. | 365/222 |
| 6,754,132 | B2 * | 6/2004 | Kyung | 365/233.1 |
| 2010/0301407 | A1 | 12/2010 | Sung | |
| 2011/0073925 | A1 | 3/2011 | Park et al. | |
| 2012/0018801 | A1 * | 1/2012 | Kobayashi et al. | 257/334 |

FOREIGN PATENT DOCUMENTS

| | | |
|---|---|---|
| KR | 1020100128465 A | 12/2010 |
| KR | 1020110035686 A | 4/2011 |
| KR | 1020110043227 A | 4/2011 |

* cited by examiner

*Primary Examiner* — Hoai V Ho
*Assistant Examiner* — Jay Radke

(57) ABSTRACT

A technology is a semiconductor cell and a semiconductor device capable of reducing the coupling capacitance between adjacent bit lines by forming a bit line junction region in a separated island shape when forming a buried bit line, thereby improving characteristics of the semiconductor devices. The semiconductor cell includes a transistor including a gate and a gate junction region, a plurality of buried bit lines disposed to intersect the gate, and a plurality of bit line junction regions, each bit line junction region having an island shape formed between the buried bit lines and connected to the buried bit line.

21 Claims, 18 Drawing Sheets

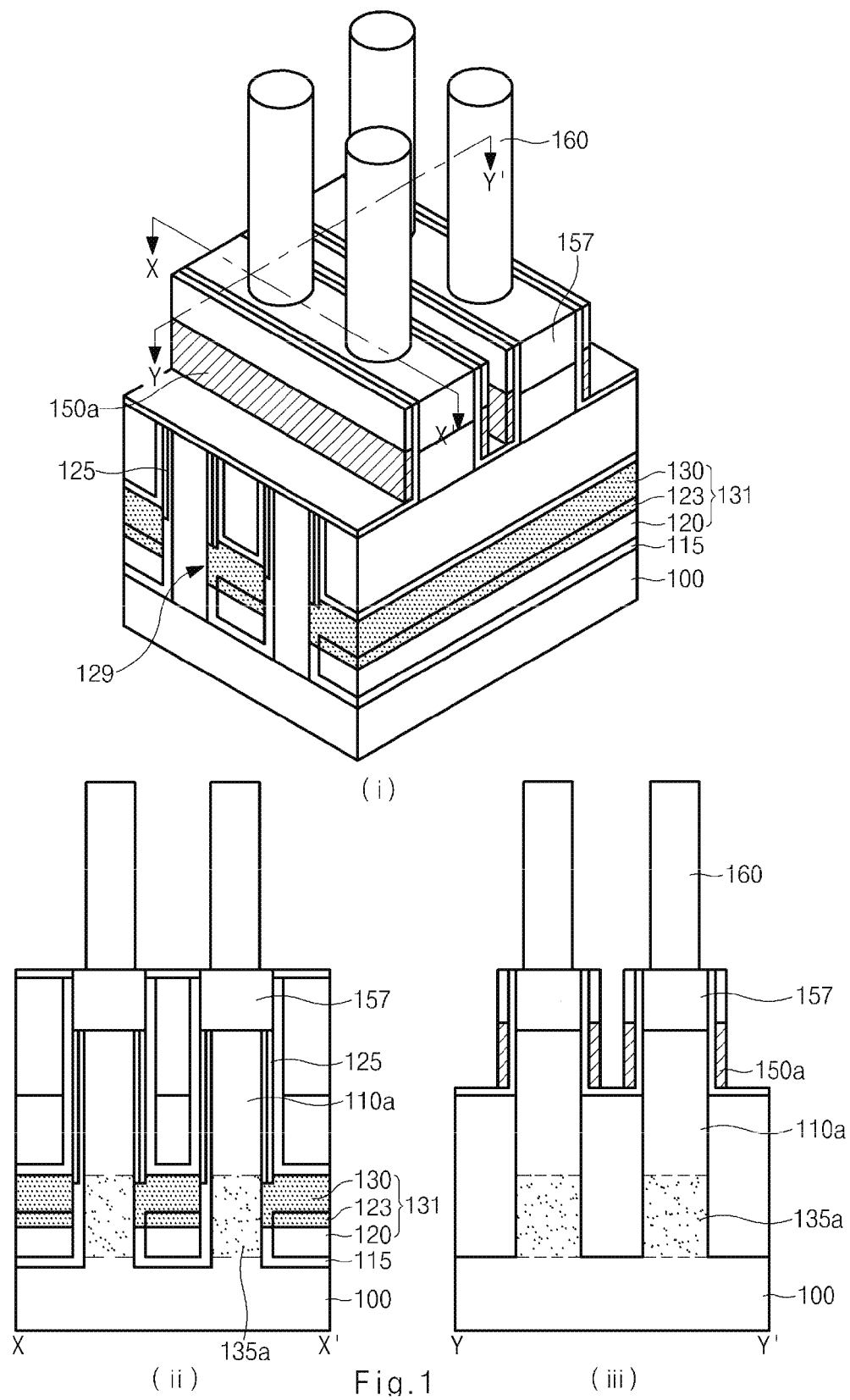

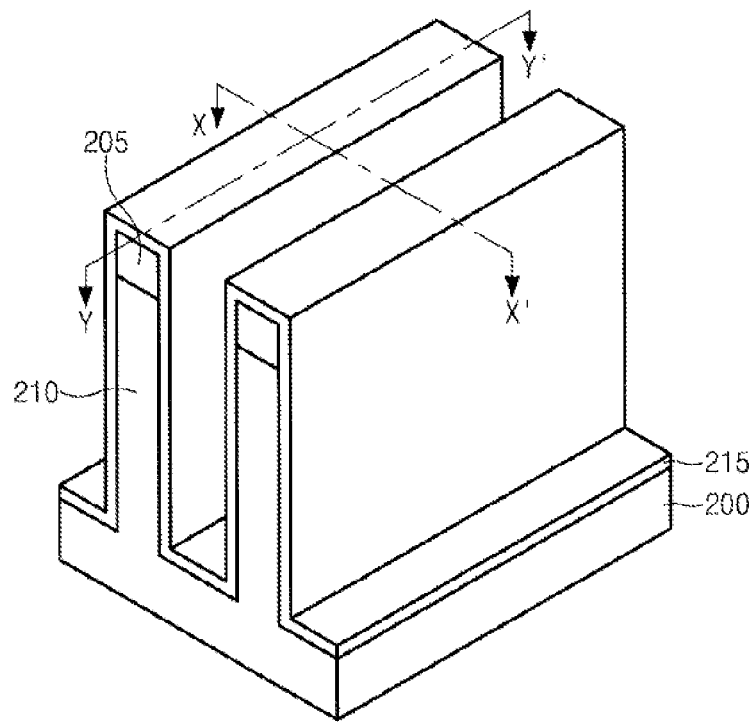
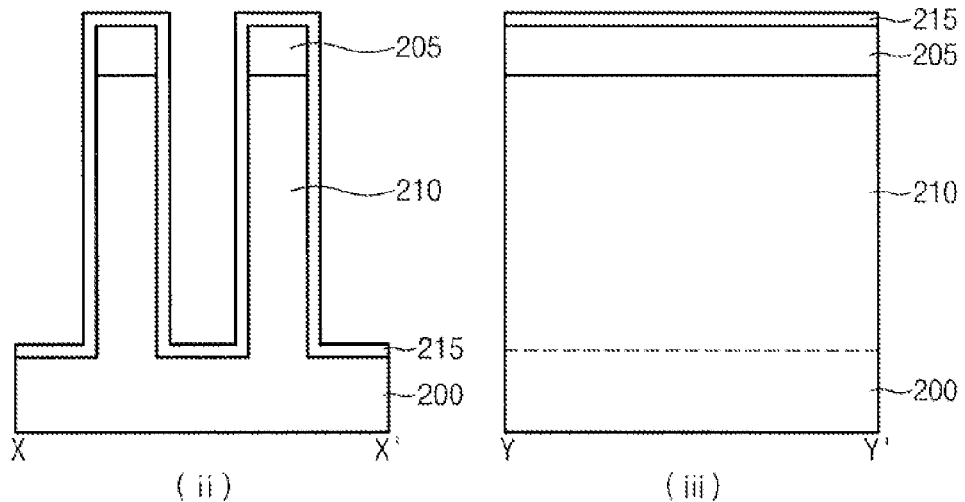
Fig.2a

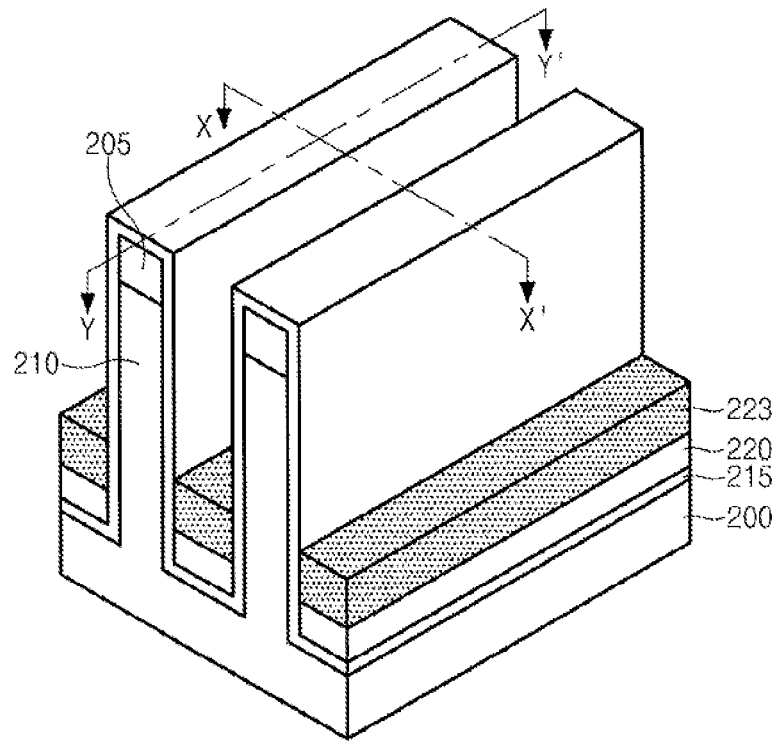
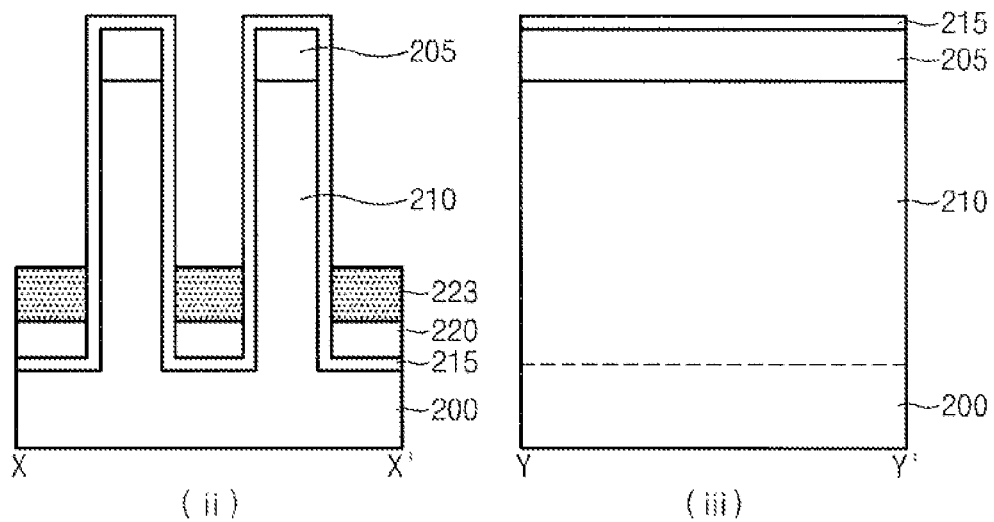
Fig.2b

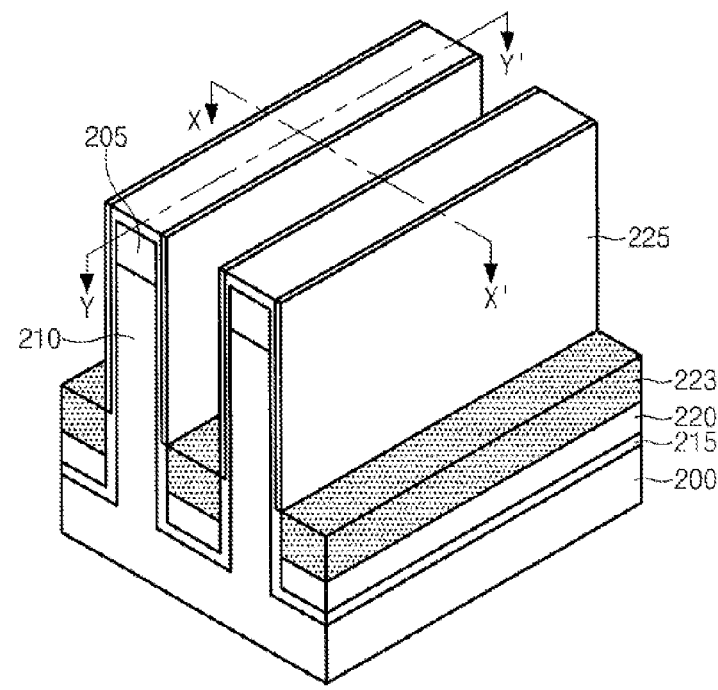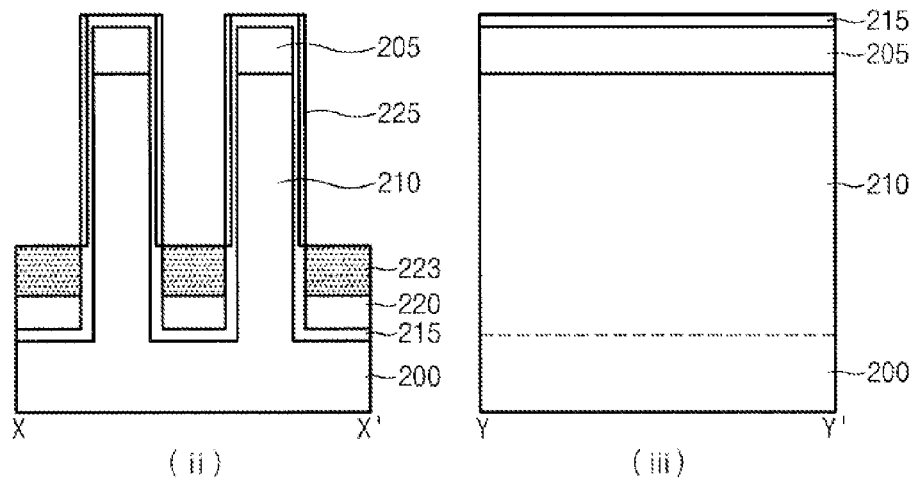
Fig.2c

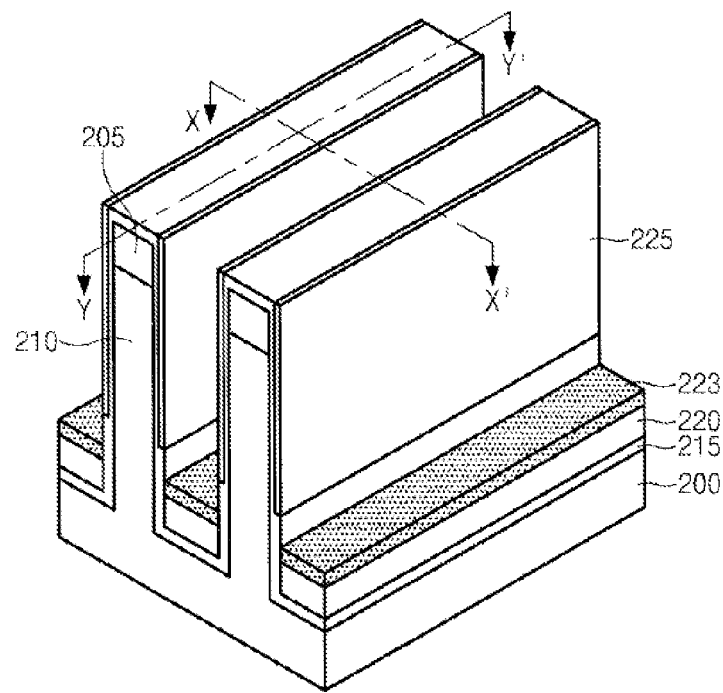
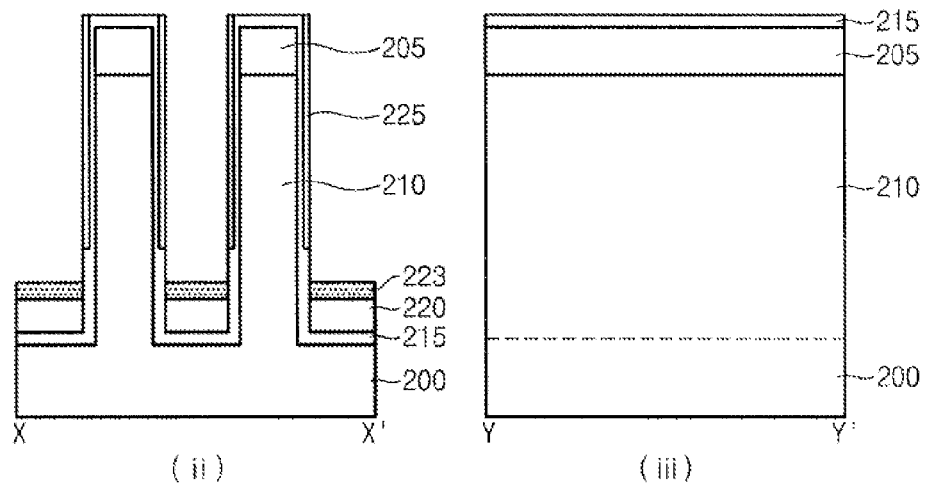
Fig.2d

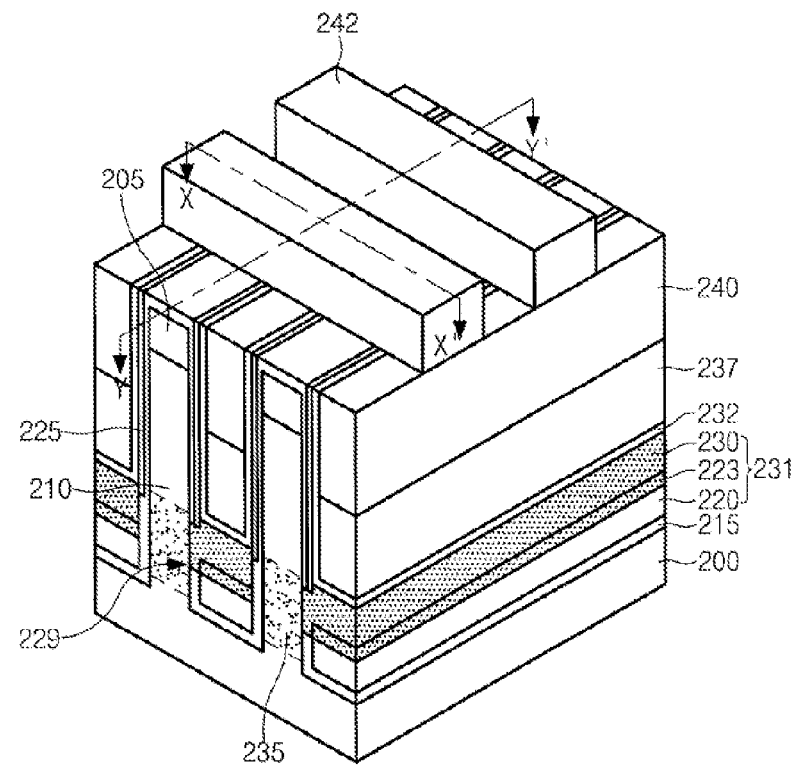
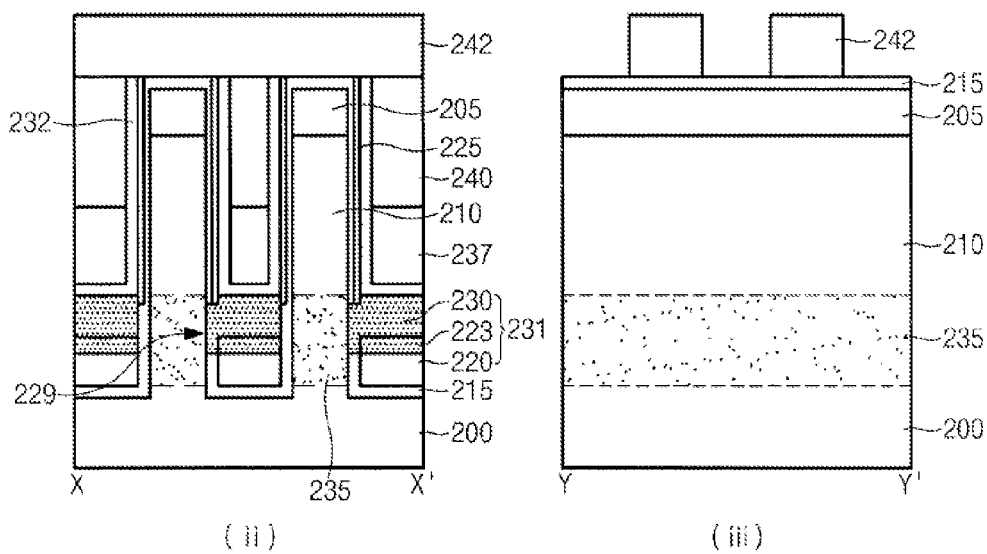
Fig.2g

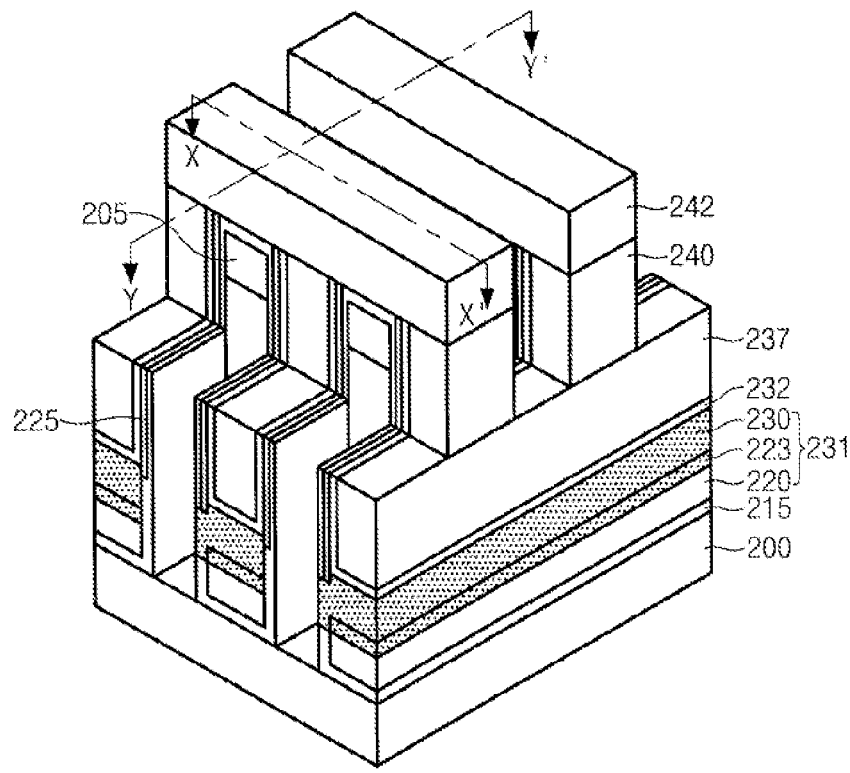
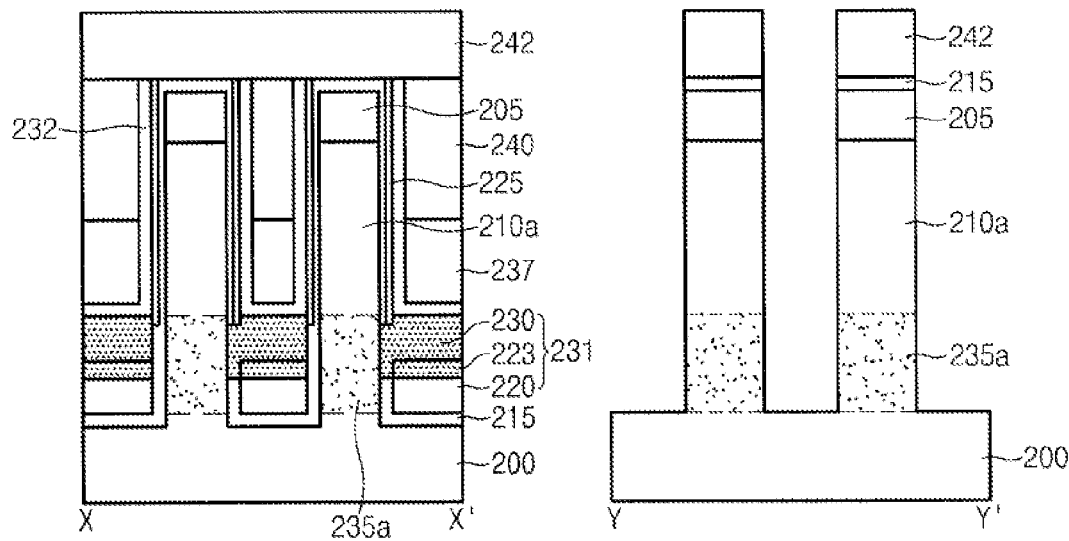
Fig.2i

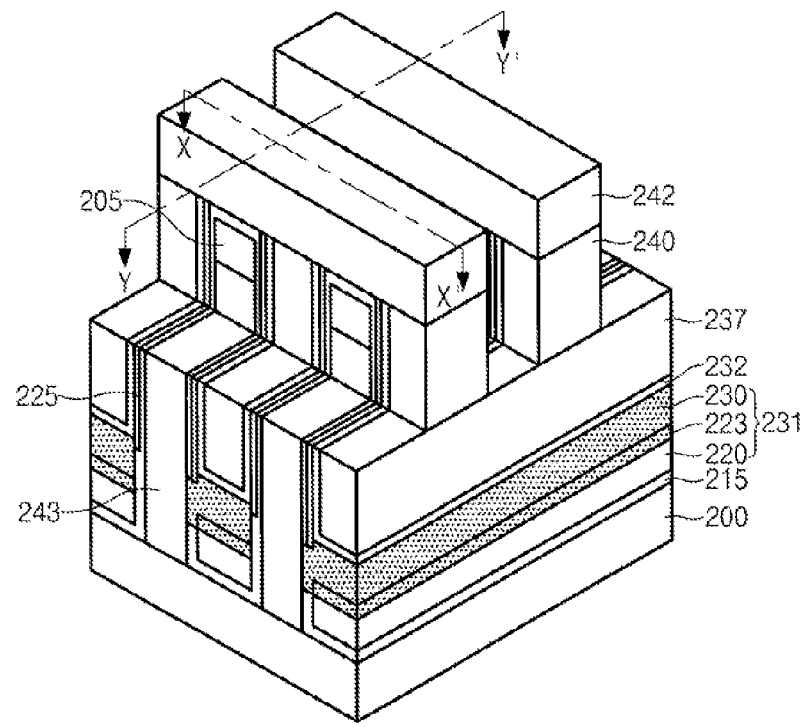
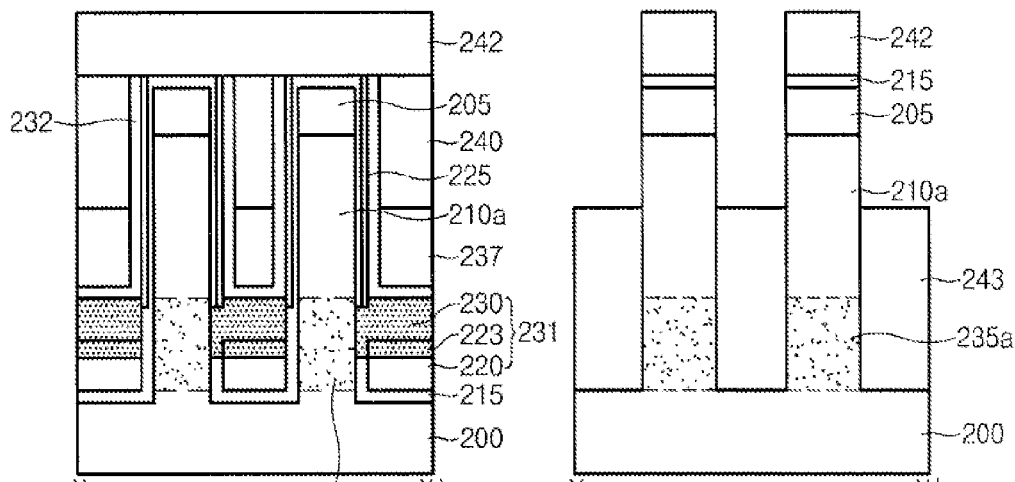
Fig.2j

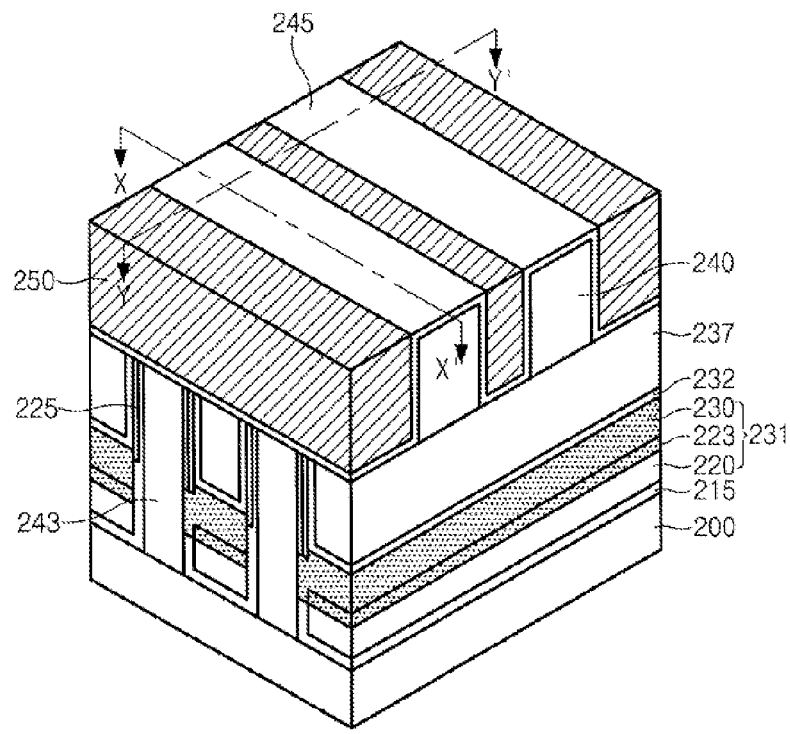
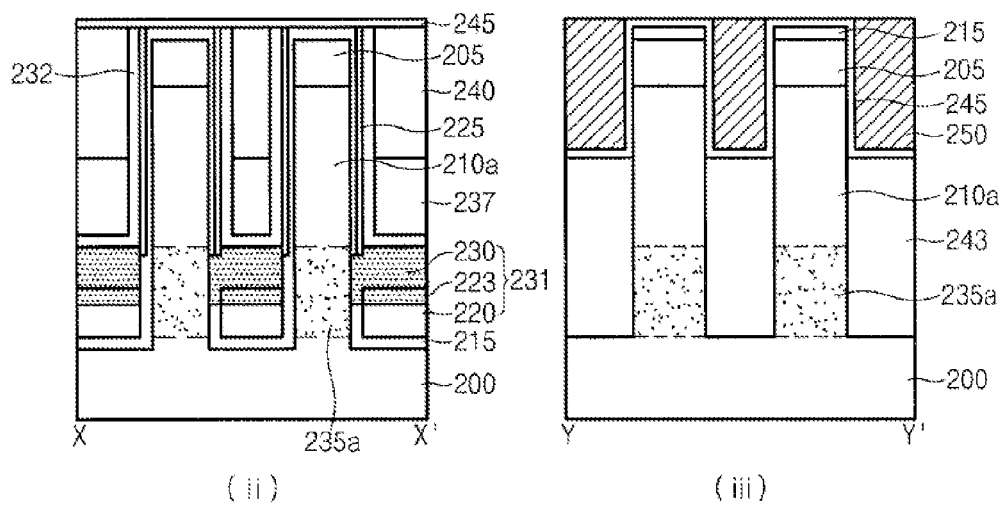
Fig.2k

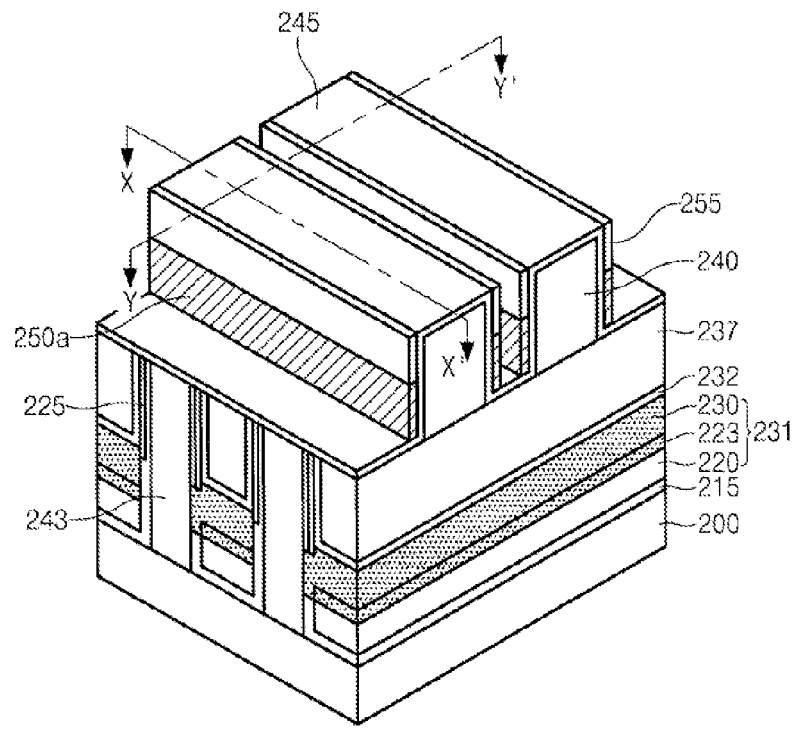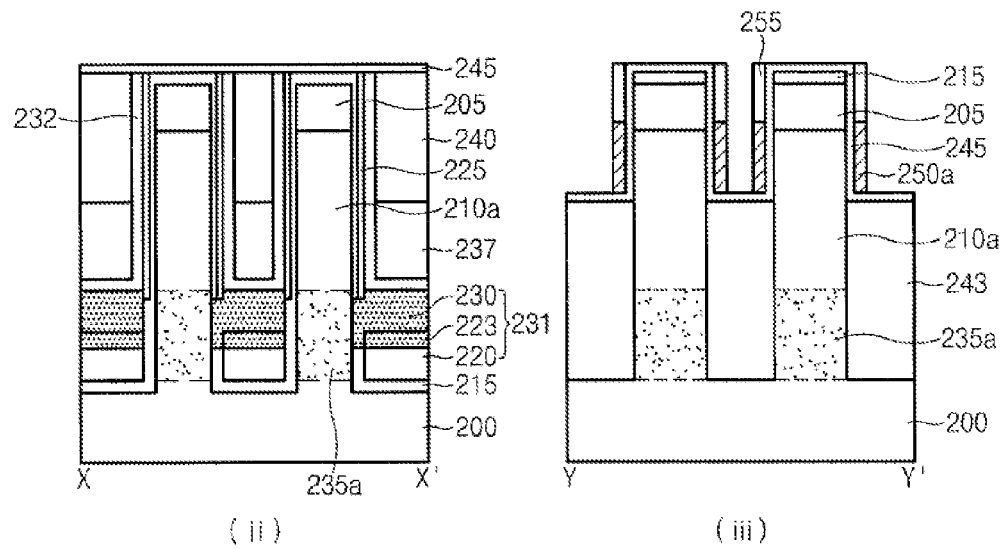
Fig. 21

Cell Array

SEMICONDUCTOR MEMORY CELL AND SEMICONDUCTOR DEVICE

CROSS-REFERENCES TO RELATED APPLICATION

The present application claims priority to Korean patent application number 10-2011-49711 filed on 25 May 2011, which is incorporated by reference in its entirety.

BACKGROUND OF THE INVENTION

1. Technical Field

The present invention relates to a semiconductor memory cell and a semiconductor device, and more particularly, to a semiconductor memory cell and a semiconductor device having a buried bit line.

2. Related Art

As the degree of integration of semiconductor devices is increased, channel lengths of transistors are gradually reduced. However, the reduction of the channel lengths of the transistors causes short channel effects such as drain induced barrier lowering (DIBL), a hot carrier effect, and punch-through. To solve this problem, various methods such as a method of reducing a depth of a junction region or a method of relatively increasing a channel length by forming a recess in a channel region of a transistor have been suggested.

However, as the integration density of the semiconductor memory devices, for example, dynamic random access memories (DRAMs) increases, fabrication of transistors having a smaller size is demanded. Accordingly, it is difficult to satisfy the desired device dimension with a current planar transistor structure in which a gate electrode is formed on a semiconductor substrate and junction regions are formed at both sides of the gate electrode even when scaling the channel length. To solve this problem, a vertical channel transistor structure has been suggested.

In recent years, there is a problem in that coupling capacitance between bit lines is increased since a buried bit line interferes with a bit line junction region due to reduction of a device size when the vertical channel transistor structure is formed. Thus, when a given buried bit line is activated, another buried bit line neighboring the given bit line may also be activated, causing a problem where data stored in a cell cannot be read properly due to noise generated when the data is amplified in a sense amplifier.

SUMMARY

According to one aspect of an exemplary embodiment, a semiconductor device includes a plurality of buried bit lines and a plurality of bit line junction regions, each having an island shape formed between the buried bit lines and connected to the buried bit line.

The buried bit line may have a line shape and the buried bit line may include any one selected from the group consisting of a titanium nitride layer, a polysilicon layer, a cobalt layer and a combination thereof.

The semiconductor device may further include a one side contact (OSC) disposed at one side of the buried bit line and the bit line junction region may be connected to the buried bit line through the OSC.

A corresponding bit line junction region may be disposed to be spaced apart from a bit line junction region adjacent to the bit line junction region in a bit line extension direction.

The semiconductor device may further include a capping layer disposed on the buried bit line. The capping layer may include a nitride layer.

According to another aspect of an exemplary embodiment, a semiconductor memory cell includes a transistor including a gate and a gate junction region, a plurality of buried bit lines disposed to cross over the gate in perpendicular fashion, and a plurality of bit line junction regions, each bit line junction region having an island shape formed between the buried bit lines and connected to the buried bit line.

The semiconductor memory cell may further include a storage unit connected to the gate junction region. The storage unit may include a capacitor.

The gate may be a vertical gate. The buried bit line may include any one selected from the group consisting of a titanium nitride layer, a polysilicon layer, a cobalt layer and a combination thereof.

The semiconductor memory cell may further include an OSC disposed at one side of the buried bit line and the bit line junction region may be connected to the buried bit line through the OSC.

A corresponding bit line junction region is disposed to be spaced apart from a bit line junction region adjacent to the bit line junction region in a bit line extension direction.

According to another aspect of an exemplary embodiment, a semiconductor device includes a core circuit area and a semiconductor memory cell array. The semiconductor memory cell array includes a transistor including a gate and a gate junction region, a capacitor connected to the gate junction region, a plurality of buried bit lines disposed to cross over the gate in perpendicular fashion, and a plurality of bit line junction regions, each bit line junction region having an island shape formed between the buried bit lines and connected to the buried bit line.

The core circuit area may include a row decoder which selects one of the word lines of the semiconductor memory cell array, a column decoder which selects one of the bit lines of the semiconductor memory cell array, and a sense amplifier which senses data stored in a semiconductor memory cell selected by the row decoder and the column decoder.

According to another aspect of an exemplary embodiment, a semiconductor module includes a semiconductor device and an external input/output (I/O) line. The semiconductor device includes a semiconductor memory cell array, a row decoder, a column decoder, and a sense amplifier. The semiconductor memory cell array includes a transistor including a gate and a gate junction region, a capacitor connected to the gate junction region, a plurality of buried bit lines disposed to cross over the gate in perpendicular fashion, and a plurality of bit line junction regions, each bit line junction region having an island shape formed between the buried bit lines and connected to the buried bit line.

The semiconductor device may further include a data input buffer, a command/address input buffer, and a resistor unit. The semiconductor module may further include an internal command/address bus which transmits a command/address signal to the command/address input buffer, and a resistor unit. The external I/O line may be electrically connected to the semiconductor device.

According to another aspect of an exemplary embodiment, a semiconductor system including a plurality of semiconductor modules and a controller which communicates data and command/address with the semiconductor module. Each of the plurality of semiconductor modules includes a semiconductor device, a command bus, and a data bus. The semiconductor device includes a semiconductor memory cell array, a row decoder, a column decoder, and a sense amplifier. The semiconductor memory cell array includes a transistor including a gate and a gate junction region, a capacitor connected to the gate junction region, a plurality of buried bit lines disposed to intersect the gate, and a plurality of bit line junction regions, each bit line junction region having an island shape formed between the buried bit lines and connected to the buried bit line.

According to another aspect of an exemplary embodiment, a method of manufacturing a semiconductor device includes forming a plurality of buried bit lines, and forming a plurality of bit line junction regions disposed between buried bit lines and coupled to the buried bit lines each bit line junction region having an island shape.

The forming the plurality of buried bit line may include forming a plurality of line patterns by etching a semiconductor substrate and burying a bit line conduction layer at a lower portion between the plurality of buried bit lines. The plurality of buried bit lines each includes any one selected from the group consisting of a titanium nitride layer, a polysilicon layer, and a cobalt layer.

The method may further, after the forming the plurality of buried bit lines, includes forming a plurality of bit line junctions region within each of the line patterns between the plurality of buried bit lines.

The method may further, after the forming the plurality of bit line junction regions, include forming an insulating layer on the buried bit line between the line patterns, forming a mask pattern defining a gate on the insulating layer and the line patterns, and forming pillar patterns separating the plurality of bit line junction regions by etching the line patterns using the mask pattern as an etch mask.

The forming the insulating layer may include stacking a first insulating layer and a second insulating layer on the plurality of buried bit lines between the line patterns. The first insulating layer may include an oxide layer and the second insulating layer may include a nitride layer.

The forming the pillar patterns separating the plurality of bit line junction regions may include forming the second insulating layer and the line patterns using the mask pattern as an etch mask and further etching the etched line patterns using the first insulating layer as an etch mask.

The method may further, after the forming the pillar patterns, includes etching an upper portion of the insulating layer to expose upper portions of the pillar patterns, forming a gate conduction material on an entire surface of a semiconductor substrate including the exposed pillar patterns, and etching the gate conduction material to form a gate at both sides of the pillar patterns.

The forming the gate at both sides of the pillar patterns may include etching an upper portion of the gate conduction material to expose the upper portions of the pillar patterns, forming a spacer at both sides of exposed pillar patterns, and etching the gate conduction material using the spacer as an etch mask. The gate conduction material may include any one selected from the group consisting of Ti, TiN, and tungsten.

These and other features, aspects, and embodiments are described below in the section entitled "DESCRIPTION OF EXEMPLARY EMBODIMENT"

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIG. 1 is a view illustrating a semiconductor device according to an exemplary embodiment of the present invention, wherein (i) is a perspective view of a semiconductor device, (ii) is a cross-sectional view of the semiconductor device taken along the line X-X' of (i), and (iii) is a cross-sectional view of the semiconductor device taken along the line Y-Y' of (i);

FIGS. 2A to 2M are views illustrating a method of manufacturing a semiconductor device according to an exemplary embodiment of the present invention, wherein (i) is a perspective view of a semiconductor device, (ii) is a cross-sectional view of the semiconductor device taken along the line X-X' of (i), and (iii) is a cross-sectional view of the semiconductor device taken along the line Y-Y' of (i);

DESCRIPTION OF EXEMPLARY EMBODIMENT

Figure 2E:
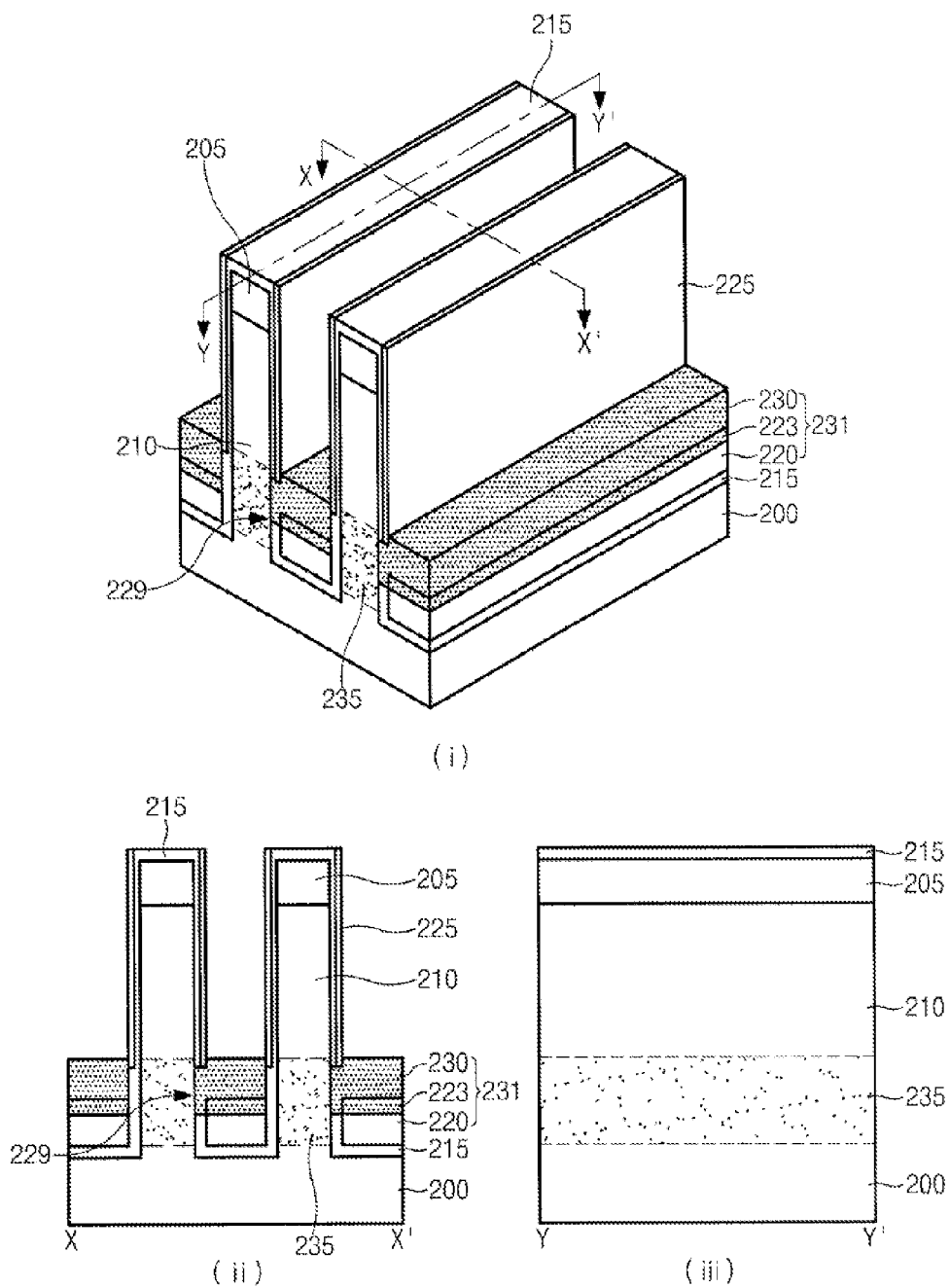

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, a semiconductor memory cell and a semiconductor device according to an exemplary embodiment of the present invention will be described in detail with reference to accompanying drawings.

FIG. 1 is a view illustrating a semiconductor memory cell including a bit line according to an exemplary embodiment of the present invention, wherein (i) is a perspective view of a semiconductor memory cell, (ii) is a cross-sectional view of the semiconductor memory cell taken along the line X-X' of (i), and (iii) is a cross-sectional view of the semiconductor memory cell taken along the line Y-Y' of (i).

Referring to FIG. 1, the semiconductor memory cell includes bit lines, bit line junction regions having island shapes separated from each other, gates arranged perpendicular to the bit lines, gate junction regions and storage units. Elements of such a semiconductor memory cell will be described in detail later.

First, a plurality of pillar patterns 110a, each including a one side contact (OSC) 129, are formed on a semiconductor substrate 100. The OSC 129 is defined by a first liner insulating layer 115 and a second liner insulating layer 125 formed on both sides and an upper surface of each of the pillar patterns 110a. The first liner insulating layer 115 may include an oxide layer and the second liner insulating layer 125 may include a nitride layer.

A bit line 131 is formed in a lower portion of the cell between the pillar patterns 110a and arranged in a Y-Y' direction. The bit line 131 may include a single layer formed of tungsten (W) or titanium nitride (TiN). Alternatively, the bit line 131 may be formed of a stacked structure of a first bit line conduction layer 120, a second bit line conduction layer 123 and a third bit line conduction layer 130. The first bit line conduction layer 120 may include titanium (Ti), TiN, or cobalt (Co), and is formed to reduce the resistance of the bit line 131. The second and third bit line conduction layers 123 and 130 may include a doped polysilicon layer.

A bit line junction region 135a is disposed within each of the pillar patterns 110a at one side of the bit line 131. The bit line junction regions 135a are formed in island shapes to be separated from each other. The bit line junction region 135a is formed in an island shape so that the coupling capacitance between the bit line 131 and the bit line 131 can be reduced.

A gate 150a which extends perpendicular to the bit line 131 is formed over the bit line 131. The gates 150a are formed in a line shape to extend along both sides of each pillar pattern 110a. A storage node junction region 157 is formed in an upper portion of each of the pillar patterns 110a, and a storage unit 160 is disposed on each of the pillar patterns 110a. Here, the storage unit 160 may include a capacitor.

As described above, the bit line junction region 135a is formed in an island shape to reduce the contact area between the bit line junction region 135a and the bit line 131, and thus the coupling capacitance between neighboring bit lines.

FIGS. 2A to 2M are views illustrating a method of manufacturing a semiconductor device according to an exemplary embodiment of the present invention, wherein (i) is a perspective view of a semiconductor device, (ii) is a cross-sectional view of the semiconductor device taken along the line X-X' of (i), and (iii) is a cross-sectional view of the semiconductor device taken along the line Y-Y' of (i). Referring to FIG. 2A, a mask pattern 205 defining a buried bit line region is formed on a semiconductor substrate 200. The mask pattern 205 may be formed in a line shape and formed of a material including a nitride layer.

Next, the semiconductor substrate 200 is etched using the mask pattern 205 as an etch mask to form a plurality of line patterns 210. Line pattern 210 is formed in a shape and extends along the Y-Y' direction by etching a portion of the semiconductor substrate 200. A first liner insulating layer 215 is deposited on a surface of the semiconductor substrate 200 including the line patterns 210 and the mask pattern 205. The first liner insulating layer 215 may be formed of a material including an oxide layer, and a thickness of the first liner insulating layer 215 may be 80 to 120 Å.

Referring to FIG. 2B, a first bit line conduction layer 220 is formed on an entire surface of the semiconductor substrate 200 including the line patterns 210 on which the first liner insulating layer 215 is formed. At this time, first bit line conduction layer 220 is formed to reduce the resistance of the bit line. The first bit line conduction layer 220 may be formed of Ti, TiN, Co, or a combination thereof. Subsequently, an etching back process is performed to etch the first bit line conduction layer 220 so that the first bit line conduction layer 220 remains in a lower portion between the line patterns 210.

Referring to FIG. 2C, a second bit line conduction layer 223 is formed on the first liner insulating layer 215 and the first bit line conduction layer 220. The second bit line conduction layer 223 may include a doped polysilicon layer. Subsequently, an etching back process is performed to etch the second bit line conduction layer 223 so that the second bit line conduction layer 223 remains on the first bit line conduction layer 220 between the line patterns 210. Here, the upper surface level of the second bit line conduction layer 223 corresponds to an upper portion of an OSC to be formed in the subsequent process.

A portion of the first liner insulating layer 215 exposed by the second bit line conduction layer 223, which is disposed on a sidewall of each of the line patterns 210 and an upper surface of the mask pattern 205, is removed. The removing the first liner insulating layer 215 may be performed through a cleaning process. At this time, the first liner insulating layer 215 may be etched by about a half of the originally formed thickness. For example, the first liner insulating layer 215 remaining after the cleaning process may have a thickness of 40 to 60 Å. Further, the first liner insulating layer 215 on a sidewall of the second bit line conduction layer 223 may also be partially removed according to a cleaning processing time. The first liner insulating layer 215 on the sidewall of the second bit line conduction layer 223 may be removed to a depth of 250 to 300 Å from the upper surface of the second bit line conduction layer 223.

Subsequently, a second liner insulating layer 225 is deposited on surfaces of the first liner insulating layer 215 and the second bit line conduction layer 223. The second liner insulating layer 225 may be formed of a material layer including a nitride layer. Next, an etching back process is performed to remove a portion of the second liner insulating layer 225 disposed on the mask pattern 205 and the second bit line conduction layer 223 so that the second liner insulating layer 225 remains on a surface of the first liner insulating layer 215 over a sidewall of each of the line patterns 210.

Referring to FIG. 2D, an upper portion of the second bit line conduction layer 223 exposed between the line patterns 210 is etched to expose the first liner insulating layer 215. Here, an upper surface level of the second bit line conduction layer 223 remaining after the etching process corresponds to a lower portion of the OSC which will be formed later. The etch uniformity of the second bit line conduction layer 223 should be well controlled to prevent the first bit line conduction layer 220 below the second bit line conduction layer 223 from being exposed.

Referring to FIG. 2E, A sacrificial conduction layer (not shown) is formed to expose the first liner insulating layer 215 and the second liner insulating layer 225 at one side of each of the line patterns 210. An exposed portion of the first liner insulating layer 215 at the one side of each of the line patterns 210 is removed to expose a portion of one side of each of the line patterns 210. The exposed portion of the line pattern 210 is an OSC 229. The first liner insulating layer 215 is an oxide-based material and the second liner insulating layer 225 is a nitride-based material with a different selectivity, so that the second liner insulating layer 225 is not removed by the etch. The sacrificial conduction layer (not shown) is removed.

Next, a third bit line conduction layer 230 is formed over the surface of the semiconductor substrate 200 including the line patterns 210. The third bit line conduction layer 230 may include the same material as the second bit line conduction layer 223, that is, a doped polysilicon layer. Subsequently, an etching back process is performed to etch the third bit line conduction layer 230 so that the third bit line conduction layer 230 remains on the second bit line conduction layer 223.

Next, ions doped in the second and third bit line conduction layers 223 and 230 of the buried bit line 231 are diffused to form a bit line junction region 235 within each of the line patterns 210. The bit line junction region 235 is formed through the OSC 229 formed at one side of the line pattern 210 so that the bit line junction region 235 having a line shape extending along the line pattern 210. Thus, the bit line junction region 235 is coupled to the bit line junction region 235 and insulated from a neighboring bit line junction region 235 by the first liner insulating layer 215 formed on the sidewall of the bit line 231. However, the first liner insulating layer 215 alone is not sufficient to prevent coupling capacitance between neighboring bit lines due to the high capacitance, and a low sensing margin.

Figure 2F:
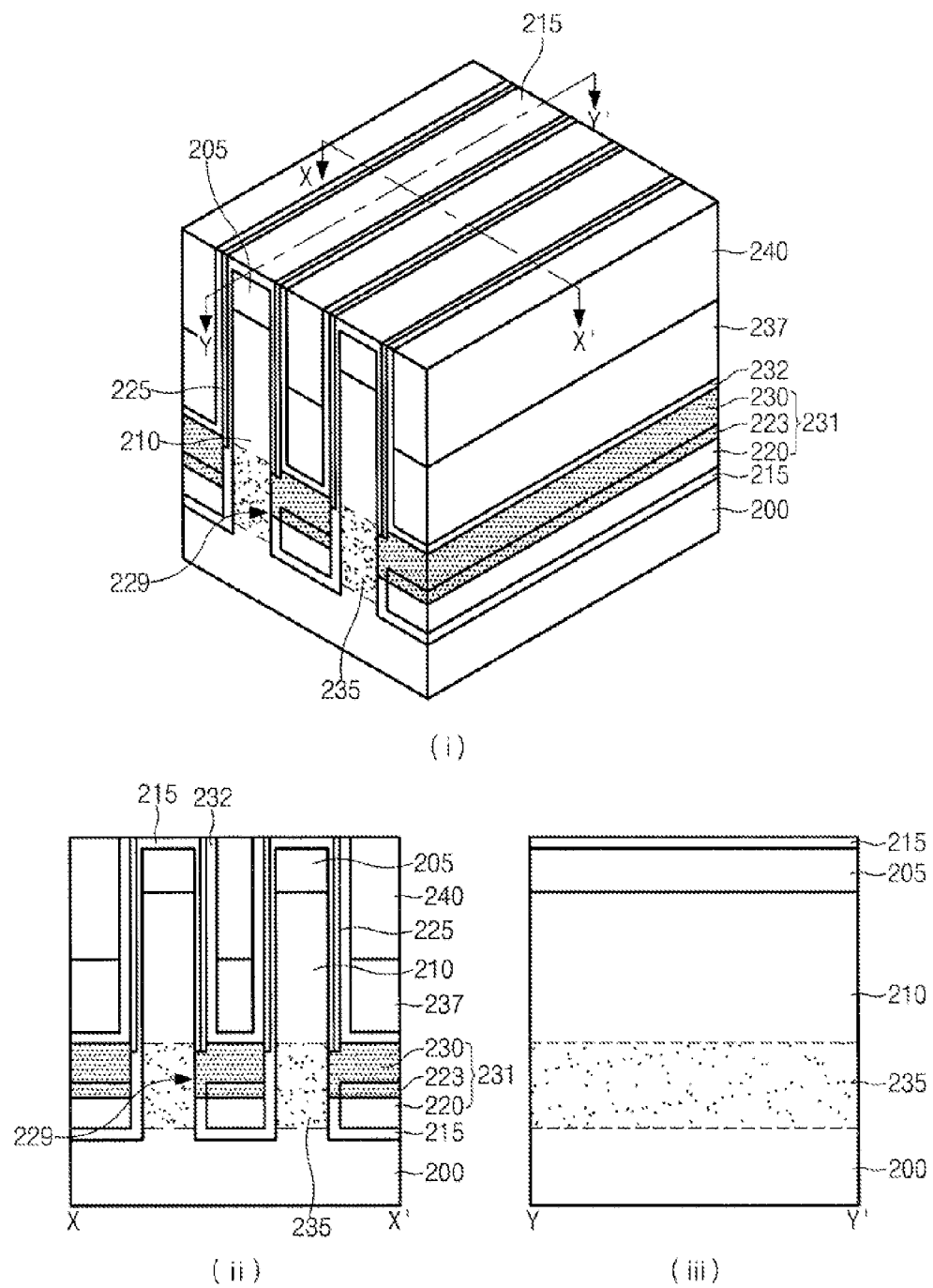

Referring to FIG. 2F, a capping layer 232 is deposited on an entire surface of the semiconductor substrate 200 including the line patterns 210 and the third bit line conduction layer 230. Subsequently, a first insulating layer 237 is formed on an entire surface of the semiconductor substrate 200 including the line patterns on which the capping layer 232 is formed and a planarization process is performed until the first liner insulating layer 215 on an upper surface of the line pattern 210 is exposed. An etching back process is performed further to etch the first insulating layer 237 to expose surfaces of the upper portions of the line patterns 210. At this time, the first insulating layer 237 may include an oxide layer and formed of a spin on dielectric (SOD) layer having a good gap-fill characteristic.

Next, a second insulating layer 240 is formed on the first insulating layer 237 and a planarization process is performed until the first liner insulating layer 215 on the upper surface of the line pattern 210 is exposed. Here, the second insulating layer 240 may include a nitride layer.

Referring to FIG. 2G, a mask pattern 242 defining a vertical gate is formed on the second insulating layer 240 and the line patterns 210. The mask pattern 242 is formed in a line shape and formed to extend in the X-X' direction of FIG. 1, which is perpendicular to the buried bit line 231.

Figure 2H:
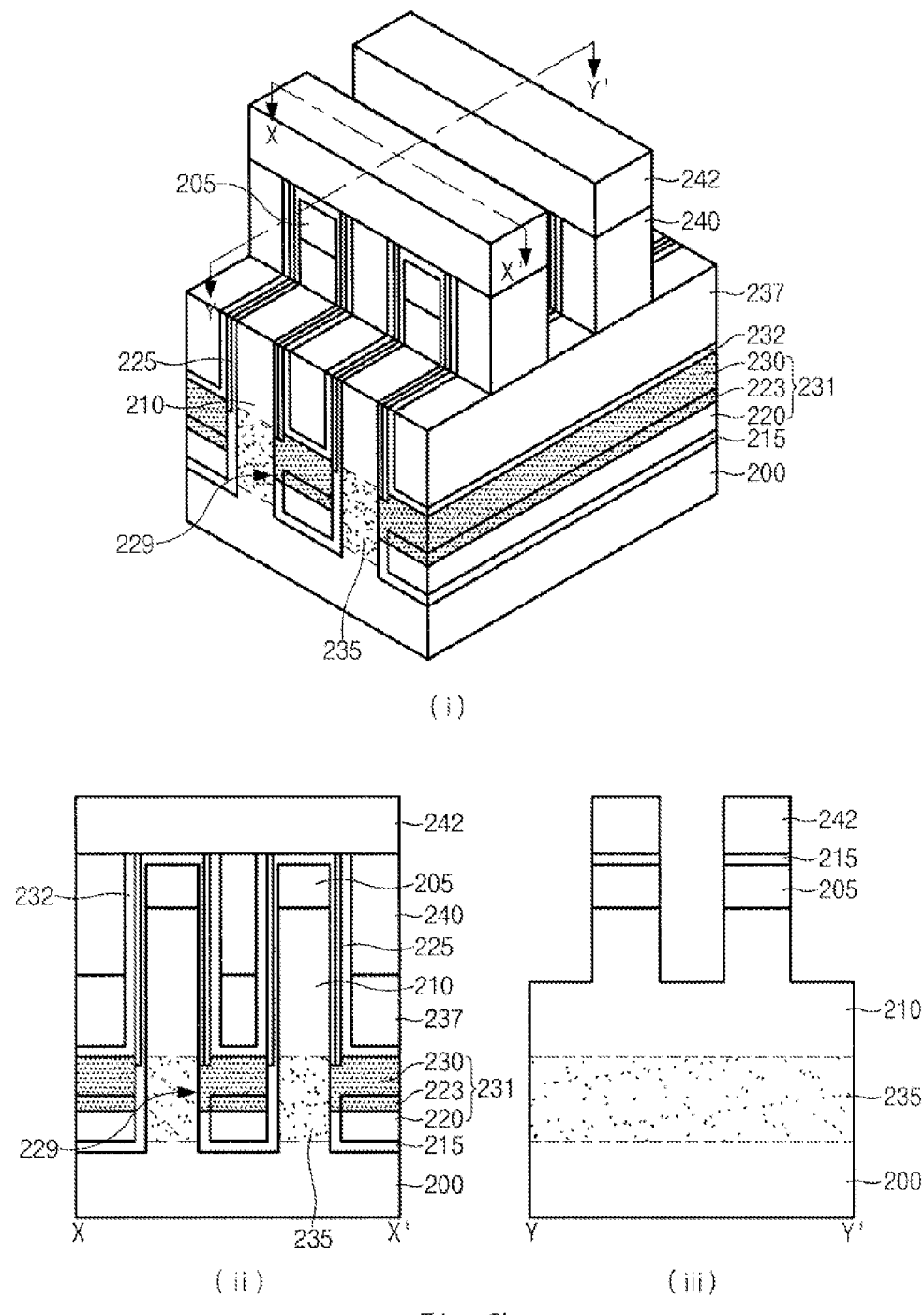

Referring to FIG. 2H, the second insulating layer 240 and upper portions of the line patterns 210 are etched using the mask pattern 242 as an etch mask. Subsequently, referring to FIG. 2I, the line patterns 210 are further etched using mask pattern 242 as an etch mask to form pillar patterns 210a. The process of etching the line patterns 210 may be performed until portions of bit line junction regions 235 are removed. As a result, a bit line junction region 235 having a line shape is separated into separate bit line junction regions 235a with an island shape. At this time, due to the etch selectivity difference between the a silicon layer of the line pattern 210 and an oxide layer of the first insulating layer 237, when the line patterns 210 are etched, the first insulating layer 237 is not etched.

Referring to FIG. 2J, a third insulating layer 243 is formed on the semiconductor substrate 200 exposed by the pillar patterns 210a. The third insulating layer 243 may be formed of a material including an oxide layer. For example, as the third insulating layer 243, any of a SOD oxide layer and a high density plasma (HDP) oxide layer may be used. More preferably, a SOD oxide layer and a HDP oxide layer may be sequentially stacked. Next, a wet cleaning process is performed to etch the third insulating layer 243, thereby exposing upper portions of the pillar patterns 210a. At this time, the third insulating layer 243 may have a higher surface level than an upper portion of the bit line junction region 235a. Next, the mask pattern 242 is removed.

Referring to FIG. 2K, a gate insulating layer 245 is formed on surfaces of the pillar patterns 210a and the third insulating layer 243 and a gate conduction material 250 is formed over the surface of the semiconductor substrate 200 including the gate insulating layer 245. The gate conduction material 250 may include TiN, W, or a combination thereof. The gate conduction material 250 may be formed on a surface of the gate insulating layer 245 in a line shape. Thus, when the gate conduction material 250 is formed in a line shape, a spacer etching process to be performed later can be omitted.

Referring to FIG. 2L, an etching back process is performed so that the gate conduction material 250 having a constant thickness remains on the third insulating layer 243 between the pillar patterns 210a. Next, a spacer material 255 is deposited over the surface of the semiconductor substrate 200 including the pillar patterns 210a and the gate conduction material 250. The spacer material is formed of any of an oxide layer, a nitride layer, or a combination thereof. It is preferable to sequentially form a nitride layer and an oxide layer. Here, a thickness of the spacer material corresponds to a line width of a gate that will be formed later.

Next, an etching back process is performed to form a spacer 255 on a surface of the gate insulating layer 245 at sidewalls of the pillar patterns 210a. The gate conduction material 250 is etched using the spacer 255 as an etch mask to form a gate 250a on the sidewalls of the pillar patterns 210a.

Figure 2M:
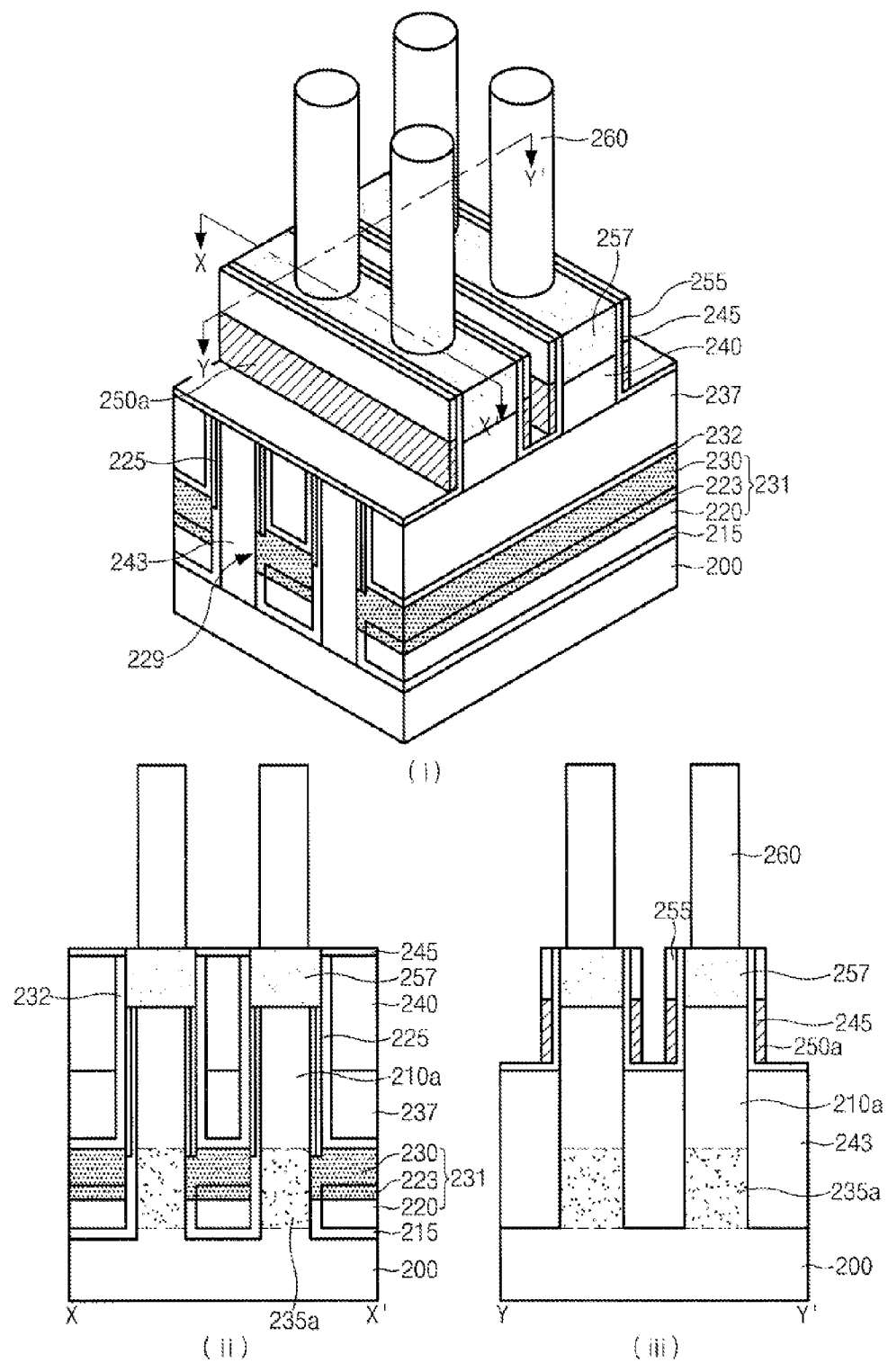

Referring to FIG. 2M, the 245, 215 and 205 is etched to form a storage node contact hole (not shown). A conductive material formed in the storage node contact hole to form a storage node junction 257. The conductive material may be including a polysilicon. The storage node junction region 257 is formed in an upper portion of each of the pillar patterns 210a and a storage node 260 having a cylinder type is formed on each of the pillar patterns 210a. The storage node 260 may be formed to be connected to the storage node junction region 257 in the upper portion of the pillar pattern 210a.

As described above, the bit line junction region 235a is formed in an island shape to reduce contact area between the bit line junction region 235a and the bit line 231 and thus the coupling capacitance between the bit line 231, and a neighboring bit line 231 can be reduced. Thereby, the refresh period is increased and thus the semiconductor device is improved.

Figure 3:
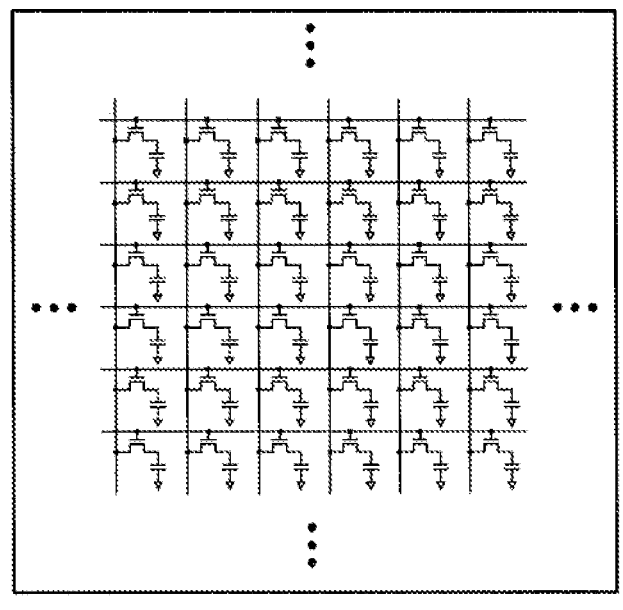
FIG. 3 is a circuit diagram illustrating a semiconductor memory cell array according to an exemplary embodiment of the present invention.

FIG. 3 is a circuit diagram illustrating a memory cell array including the above-described exemplary embodiments of the present invention.

Typically, the memory cell array includes a plurality of memory cells and each memory cells includes one transistor and one capacitor. Such memory cells are disposed at intersections of bit lines BL1, . . . , BLn and word lines WL1, . . . , WLm. The memory cells store and output data based on voltages applied to the bit lines BL1, . . . , BLn and the word lines WL1, . . . , WLm selected by a column decoder and a row decoder.

As shown in FIG. 3, in the memory cell array, the bit lines BL1, . . . , BLn are formed to extend in a first direction (this is, bit line direction) as a length direction and the word lines WL1, . . . , WLm are formed to extend in a second direction (that is, word line direction) as a length direction so that the bit lines BL1, . . . , BLn and the word lines WL1, . . . , WLm are disposed to intersect each other. A first terminal (for example, a drain terminal) of the transistor is connected to the bit line BL1, . . . , BLn, a second terminal (for example, a source terminal) is connected to the capacitor, and a third terminal (for example, a gate terminal) may is connected to the word line WL1, . . . , WLm. A plurality of memory cells including the bit lines BL1, . . . , BLn and word lines WL1, . . . , WLm are disposed within the memory cell array.

Here, the bit line is formed as illustrated in FIG. 1. One side of the bit line may be connected to the bit line junction region and the bit line junction regions may have island shapes separated from each other.

As described above, the memory cell array according to the exemplary embodiment can reduce coupling capacitance between the bit lines and thus improve characteristics of the devices.

Figure 4:
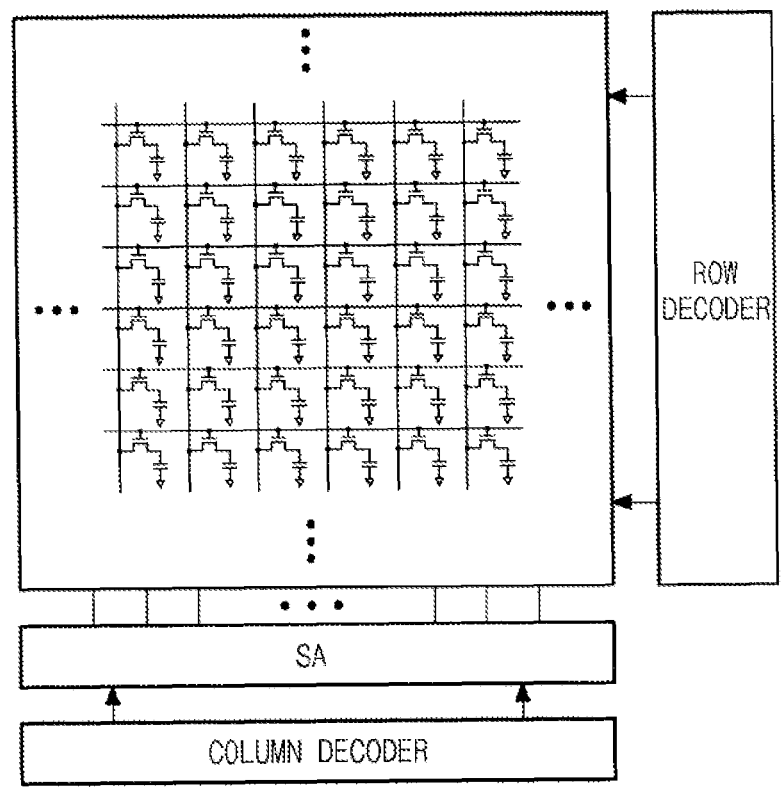
FIG. 4 is a block diagram illustrating a memory device according to an exemplary embodiment of the present invention.

FIG. 4 is a block diagram illustrating a memory device according to an exemplary embodiment of the present invention.

Referring to FIG. 4, the memory device may include a semiconductor memory cell array, a row decoder, a column decoder, and a sense amplifier. The row decoder selects a word line corresponding to a memory cell in which a read or write operation is to be performed of word lines of the memory cell array and outputs a word line select signal (RS) to the memory cell array. The column decoder selects a bit line corresponding to a memory cell in which a read or write operation is to be performed of bit lines of the memory cell array and outputs a bit line select signal (CS) to the memory cell array. Further, the sense amplifier senses data BDS stored in a memory cell selected by the row decoder and a column decoder.

Here, the bit line is formed as illustrated in FIG. 1. One side of the bit line may be connected to the bit line junction region and the bit line junction regions may be formed in island shapes separated from each other. As described above, the memory device according to the exemplary embodiment can reduce coupling capacitance between the bit lines and thus improve characteristics of the devices.

The semiconductor device according to the exemplary embodiment may be applied to dynamic random access memories (DRAMs), but it is not limited thereto and it may be applied to static random access memories (SRAMs), flash memories, ferroelectric random access memories (FeRAMs), magnetic random access memories (MRAMs), phase change random access memories (PRAMs).

As main element group of the above-described semiconductor device, there are desktop computers, portable computers, computing memories used in servers, graphics memories having various specs, and mobile memories concentrated on a lot of attention with the development of mobile communication in recent years. Further, the above-described semiconductor device may be provided to various digital applications such as mobile recording mediums such as memory stick, multimedia card (MMC), secure digital (SD), compact flash (CF), extreme digital (xD) picture card, universal serial bus (USB) flash device as well as various digital applications such as MP3P, portable multimedia player (PMP), a digital camera, a camcorder, a mobile phone. A single type semiconductor device may be applied to a technology such as multi-chip package (MCP), disk on chip (DOC), or embedded device. The single type semiconductor device may be applied to a CMOS image sensor (CIS) to be provided to various fields such as a camera phone, a web camera, a small-size image pick-up device for medicine.

Figure 5:
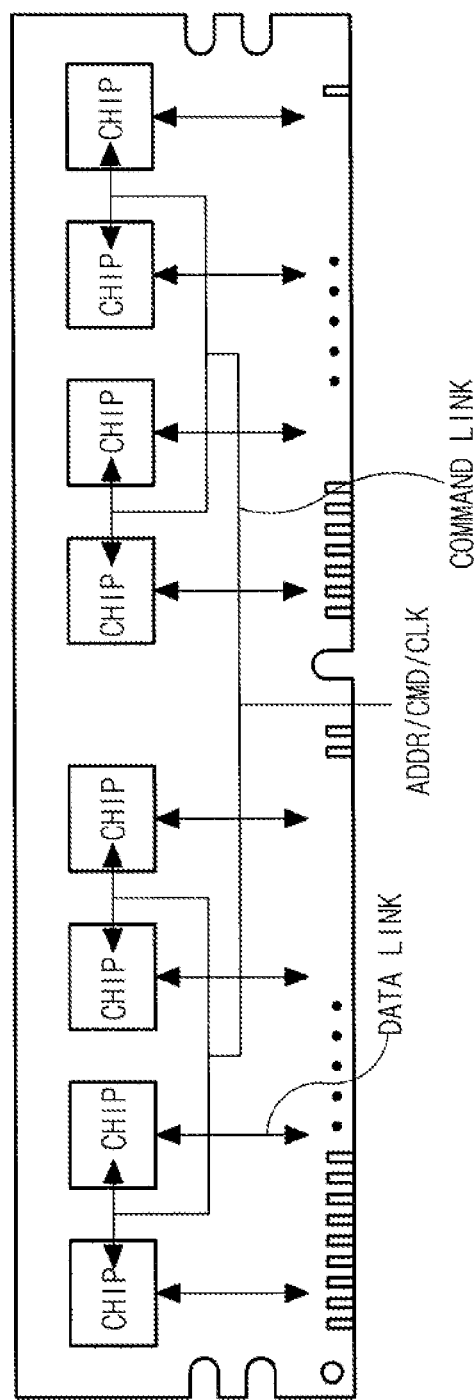
FIG. 5 is a block diagram illustrating a memory module according to an exemplary embodiment of the present invention.
Figure 6:
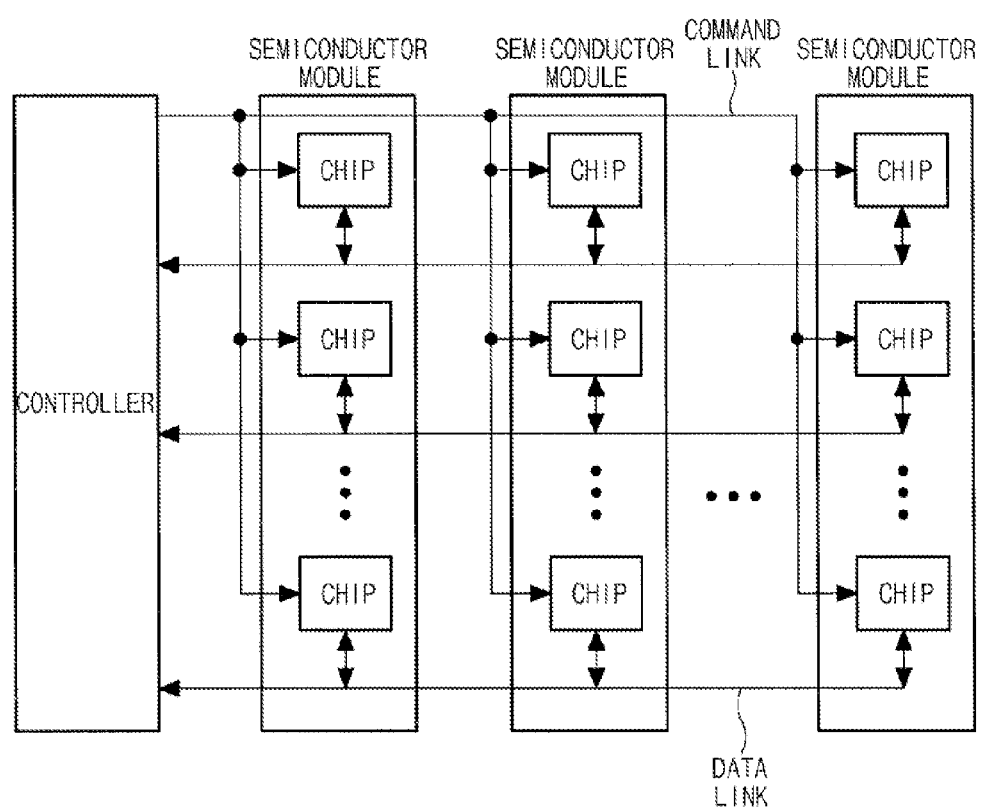
FIG. 6 is a block diagram illustrating a memory system according to an exemplary embodiment of the present invention.

FIG. 5 is a block diagram illustrating a memory module according to an exemplary embodiment of the present invention.

Referring to FIG. 5, the memory module includes a plurality of semiconductor devices mounted on a module substrate, a command bus which allows the semiconductor devices to receive control signals (address signal (ADDR), command signal (CMD), clock signal (CLK)) from an external controller (not shown), and a data bus which is connected to the semiconductor devices and transfers data to the semiconductor devices.

Here, the same as command bus and the data bus as that used in the conventional memory module may be used or the command bus and the data bus similar to that used in the conventional memory module may be used.

Although FIG. 5 illustrates 8 semiconductor devices mounted on a front of the memory module, the semiconductor devices are also mounted on a rear of the module substrate in the same manner. That is, the semiconductor devices may be mounted on one side or both sides of the module substrate and the number of semiconductor devices is not limited to FIG. 5. In addition, material and construction of the module substrate are not specifically limited thereto.

The bit line formed within such the memory module is formed as illustrated in FIG. 1. One side of the bit line may be connected to the bit line junction region and the bit line junction regions may be formed in island shapes separated from each other.

As described above, the memory module according to the exemplary embodiment can reduce coupling capacitance between the bit lines and thus improve characteristics of the devices.

FIG. 7 is a block diagram illustrating a memory system according to an exemplary embodiment of the present invention.

Referring to FIG. 7, the memory system includes a memory module including one or more semiconductor devices. The memory system includes a memory controller communicates data and command/address signals with the memory module through a system bus.

The bit line formed within the semiconductor device of the memory system is formed as illustrated in FIG. 1. One side of the bit line may be connected to the bit line junction region and the bit line junction region may be formed in island shapes separated from each other.

As described above, a semiconductor module according to the exemplary embodiment can reduce coupling capacitance between the bit lines and thus improve characteristics of the devices.

The semiconductor memory cell and the semiconductor device according to the above-described exemplary embodiment can provide the following effects.

First, there is an advantageous effect from reducing the coupling capacitance between adjacent bit lines.

Secondly, it is effective for preventing a barrier metal layer of the bit line from oxidizing in a vertical gate oxidation process.

Thirdly, it can prevent line patterns from being attacked due to a thick insulating layer formed on a sidewall of the line pattern in an etching back process after forming the barrier metal layer.

Fourthly, there is an effect of reducing leakage current of the junction region since a silicon layer of the line pattern is in touch with a doped polysilicon of the bit line conduction layer.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:
1. A semiconductor device, comprising:
a buried bit line; and
a plurality of bit line junction regions formed by diffusing ions doped in the buried bit line disposed and directly coupled to the buried bit line, each bit line junction region having an island shape, wherein the plurality of bit line junction regions are disposed to be spaced apart from neighboring bit line junction regions which are arranged in the same direction as the buried bit line.

2. The semiconductor device of claim 1, wherein the buried bit line has a line shape.

3. The semiconductor device of claim 1, wherein the buried bit line includes at least one selected from the group consisting of a titanium nitride layer, a polysilicon layer, and a cobalt layer.

4. The semiconductor device of claim 1, the device further comprising a one side contact (OSC) disposed at one side of the buried bit line.

5. The semiconductor device of claim 4, wherein the plurality of bit line junction regions are connected to the buried bit line through the OSC.

6. The semiconductor device of claim 1, the device further comprising a capping layer disposed over the buried bit line.

7. The semiconductor device of claim 6, wherein the capping layer includes a nitride layer.

8. A semiconductor memory cell, comprising:
a transistor including a gate and a gate junction region;
a buried bit line disposed to intersect the gate; and
a plurality of bit line junction regions formed by diffusing ions doped in the buried bit line, each bit line junction region having an island shape and directly coupled to the buried bit line, wherein the plurality of bit line junction regions are disposed to be spaced apart from neighboring bit line junction regions which are arranged in the same direction as the bit line.

9. The semiconductor memory cell of claim 8, further comprising a storage unit coupled to the gate junction region.

10. The semiconductor memory cell of claim 9, wherein the storage unit includes a capacitor.

11. The semiconductor memory cell of claim 8, wherein the gate is a vertical gate.

12. The semiconductor memory cell of claim 8, wherein the buried bit line includes any selected from the group consisting of a titanium nitride layer, a polysilicon layer, a cobalt layer and a combination thereof.

13. The semiconductor memory cell of claim 8, further comprising a one side contact (OSC) disposed at one side of the buried bit line.

14. The semiconductor memory cell of claim 13, wherein the bit line junction region is coupled to the buried bit line through the OSC.

15. A semiconductor device, comprising:
a core circuit area; and
a semiconductor memory cell array which includes a plurality of semiconductor memory cell of claim 8.

16. The semiconductor device of claim 15, wherein the core circuit area includes:
a row decoder which selects word lines of the semiconductor memory cell array;
a column decoder which selects bit lines of the semiconductor memory cell array; and
a sense amplifier which senses data stored in a semiconductor memory cell selected by the row decoder and the column decoder.

17. A semiconductor module, comprising:
a semiconductor device of claim 15; and
an external input/output (I/O) line.

18. The semiconductor module of claim 17, wherein the semiconductor device further includes:
a data input buffer; and
a command/address input buffer.

19. The semiconductor module of claim 18, the module further comprising:
an internal command/address bus which transmits a command/address signal to the command/address input buffer.

20. The semiconductor module of claim 17, wherein the external I/O line is coupled to the semiconductor device.

21. A semiconductor system, comprising:
a semiconductor module of claim 17; and
a controller which communicates data and command/address with the semiconductor module.

* * * * *